United States Patent
Gautama

(10) Patent No.: US 10,498,304 B2
(45) Date of Patent: Dec. 3, 2019

(54) AUDIO PROCESSOR

(71) Applicant: NXP B.V., Eindhoven (NL)

(72) Inventor: Temujin Gautama, Boutersem (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/038,386

(22) Filed: Jul. 18, 2018

(65) Prior Publication Data

US 2019/0068152 A1 Feb. 28, 2019

(30) Foreign Application Priority Data

Aug. 22, 2017 (EP) .................................... 17187370

(51) Int. Cl.
| | | |
|---|---|---|
| *H03G 3/00* | (2006.01) | |
| *H03G 3/30* | (2006.01) | |
| *G01K 3/00* | (2006.01) | |
| *H03G 5/16* | (2006.01) | |
| *H04R 29/00* | (2006.01) | |
| *H04R 3/04* | (2006.01) | |

(52) U.S. Cl.
CPC .......... *H03G 3/3005* (2013.01); *G01K 3/005* (2013.01); *H03G 5/165* (2013.01); *H04R 3/04* (2013.01); *H04R 29/001* (2013.01); *H04R 29/003* (2013.01); *H04R 2430/01* (2013.01); *H04R 2499/13* (2013.01)

(58) Field of Classification Search
CPC combination set(s) only.
See application file for complete search history.

(56) References Cited

U.S. PATENT DOCUMENTS

| | | | |
|---|---|---|---|
| 8,750,525 B2* | 6/2014 | Martz .................... | H04R 3/007 330/254 |
| 9,131,302 B2 | 9/2015 | Williams et al. | |
| 10,123,116 B2* | 11/2018 | Bjork .................... | G10L 21/038 |
| 2002/0125945 A1 | 9/2002 | Taylor | |
| 2009/0028371 A1* | 1/2009 | Bailey .................... | H04R 9/025 381/386 |
| 2009/0257599 A1* | 10/2009 | Sand Jensen ............. | H03F 1/52 381/55 |
| 2011/0123047 A1* | 5/2011 | Wu ........................ | H04R 3/007 381/107 |
| 2012/0237045 A1 | 9/2012 | Mihelich et al. | |
| 2012/0328117 A1* | 12/2012 | Gautama .................. | H03F 1/52 381/59 |
| 2013/0108099 A1* | 5/2013 | Kemmerer ............. | H04R 9/022 381/397 |

(Continued)

OTHER PUBLICATIONS

Hutt, S., "Ambient Temperature influences on OEM Automotive Loudspeakers", Audio Engineering Society, Convention Paper 5507, Presented at the 112th Convention, May 10-13, 2002.

*Primary Examiner* — Duc Nguyen
*Assistant Examiner* — Assad Mohammed

(57) ABSTRACT

An audio processor is described. The audio processor includes a sensor input; an audio input for receiving an audio input signal; an audio output for outputting an audio signal to a loudspeaker. The audio processor is configured to determine a parameter value representative of temperature from a sensor signal received on the sensor input; process a received audio input signal by increasing the audio signal power in response to the temperature being below a predetermined threshold; and output the processed audio signal on the audio output.

20 Claims, 5 Drawing Sheets

(56) References Cited

U.S. PATENT DOCUMENTS

| | | | |
|---|---|---|---|
| 2014/0126730 A1* | 5/2014 | Crawley | H04R 29/001 381/59 |
| 2014/0321656 A1* | 10/2014 | Kim | H04R 3/007 381/58 |
| 2015/0319529 A1 | 11/2015 | Klippel | |
| 2017/0353801 A1* | 12/2017 | Li | H04R 9/022 |

* cited by examiner

AUDIO PROCESSOR

CROSS-REFERENCE TO RELATED APPLICATIONS

This application claims the priority under 35 U.S.C. § 119 of European Patent application no. 17187370.6, filed on 22 Aug. 2017, the contents of which are incorporated by reference herein.

FIELD

This disclosure relates to an audio processor and a method of audio processing.

BACKGROUND

Audio systems used in for example vehicle infotainment systems may be expected to operate under a variety of ambient temperatures typically between −40° C. and 40° C. In operation, the sound system may be switched on when the vehicle cabin is at the ambient environmental temperature, after which the vehicle heating/cooling system will gradually increase or decrease the temperature in the car until the desired temperature is reached. Audio systems may include algorithms for speaker protection which typically reduce the audio output volume to reduce the speaker voice coil temperature in order to avoid damaging the speaker.

SUMMARY

Various aspects of the disclosure are defined in the accompanying claims. In a first aspect there is defined an audio processor comprising: a sensor input; an audio input for receiving an audio input signal; an audio output for outputting an audio output signal to a loudspeaker; wherein the audio processor is configured to determine a parameter value representative of temperature from a sensor signal received on the sensor input; increase the audio signal power in response to the temperature being below a predetermined threshold.

Embodiments may further comprise a controller having an input coupled to the sensor input, and a controller output; wherein the controller is configured to determine the parameter value representative of temperature and to generate a control output signal in response to the temperature being below the predetermined threshold.

Embodiments may further comprise a processor module having a first input coupled to the audio input, a second input coupled to the controller output, and an output coupled to the audio output.

In embodiments, the processor module may comprise a mixer and the controller may be configured to generate a reference signal comprising one or more frequencies below the audible frequency band, wherein the generated control output signal comprises the reference signal and the audio processor is configured to increase the audio signal power by mixing the reference signal with the audio input signal.

In embodiments, the sensor signal may comprise the reference signal.

In embodiments, the processor module may comprise at least one of a dynamic range compressor and an equalizer and wherein the processor module is configured to increase the audio signal power by processing the audio input signal to increase the signal power of the audio input signal at frequencies below a predetermined value and outputting the processed audio signal.

In embodiments, the sensor input may be configured to be coupled to the loudspeaker and the sensor signal may correspond to the current flowing into the loudspeaker voice coil.

In embodiments, the audio processor may further comprise a voltage sensor input configured to be coupled to the loudspeaker, wherein the voltage sensor input is coupled to the controller and the controller is configured to detect a speaker voice coil voltage from a voltage sense signal received on the voltage sense input.

In embodiments, the audio input may be coupled to the controller and the controller may be configured to determine a speaker voice coil voltage value from the audio input.

In embodiments, the controller may be further configured to determine the resonant frequency of the loudspeaker from the voice coil voltage and the sensor signal, wherein the parameter value comprises the resonant frequency value, and wherein the audio processor is further configured to increase the audio signal power in response to the resonant frequency value being above a predetermined resonant frequency threshold value.

In embodiments, the controller may be further configured to determine the DC resistance of the voice coil from the voice coil voltage and the sensor signal, wherein the parameter value comprises the DC resistance value, and wherein the audio processor is further configured to increase the audio signal power in response to the DC resistance being below a predetermined DC resistance threshold value.

In embodiments, the controller output may be configured to be coupled to a speaker driver and wherein the generated control output signal increases the DC offset of the output signal from the speaker driver, wherein the increased DC offset increases the audio signal power.

In embodiments, the controller may comprise a further output configured to be coupled to a speaker driver and wherein the generated control output signal increases the DC offset of the output signal from the speaker driver, wherein the increased DC offset increases the audio signal power.

Embodiments of the audio processor may be included in an audio system further comprising a speaker driver having an input coupled to the audio output and an output coupled to a loudspeaker.

In a second aspect there is defined a method of audio processing, the method comprising receiving a sensor signal; determining a parameter value representative of temperature from a sensor signal; increasing the audio signal power provided to a loudspeaker in response to the temperature being below a predetermined threshold.

In embodiments, the method may further comprise increasing the audio signal power by at least one of generating a signal comprising one or more frequencies below the audible frequency band and combining the generated signal with the audio input signal; adding a DC offset to the audio output signal; equalizing the audio input signal to increase the amplitude of the audio signal at frequencies below a predetermined value; and performing a dynamic range compression of the audio input signal.

In embodiments, the received sensor signal may indicate a current flow through a loudspeaker voice coil, and determining the parameter value may comprise determining a voice coil voltage and at least one of: determining a value of resonant frequency of the voice coil from the voice coil voltage and the sensor signal; and determining a value of DC resistance of the voice coil from the voice coil voltage and the sensor signal.

In a third aspect there is described a computer program product comprising instructions which, when being executed by a processing unit, cause said processing unit to perform the steps of receiving a sensor signal; determining a parameter value representative of temperature from a sensor signal; increasing the audio signal power provided to a loudspeaker in response to the temperature being below a predetermined threshold.

In the figures and description like reference numerals refer to like features. Embodiments are now described in detail, by way of example only, illustrated by the accompanying drawings in which.

DESCRIPTION

Figure 1:
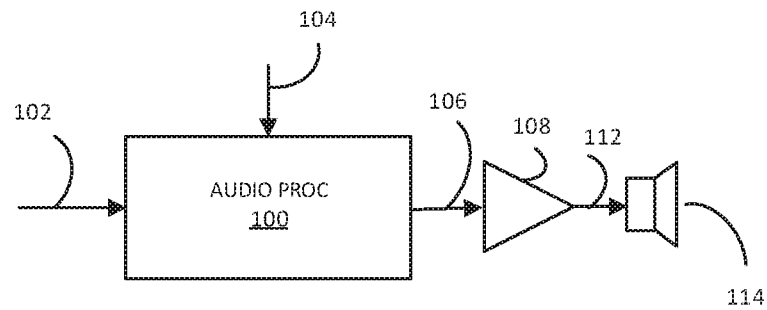
FIG. 1 shows an audio processor according to an embodiment.

FIG. 1 shows an audio processor 100 according to an embodiment. The audio processor 100 may have an audio input 102, a sensor input 104, and an audio output 106. In operation, the audio output 106 may be connected to a speaker driver 108 which may be a class-D amplifier. The output 112 of the speaker driver 108 may be connected to a loudspeaker 114. The audio processor 100 may determine a parameter value corresponding to a value of temperature from a sensor signal received on the sensor input 104. In some examples, where the sensor signal may be generated from a temperature sensor (not shown), the parameter value may be determined directly from the value of the sensor signal. In other examples, the sensor input may be connected to the speaker driver output 108 and the sensor signal may correspond to the voice coil current of the loudspeaker 114. The sensor signal may include a reference signal generated by the audio processor which may be used to determine the voice coil current.

In some examples, the sensor signal may include the voice coil current and voltage of the loudspeaker voice coil. In these examples, the determined parameter value may be the resonant frequency of the loudspeaker or the DC resistance of the voice coil. If the parameter value corresponds to a temperature below a certain threshold, the audio processor 100 may increase the signal power of the audio signal received by the loudspeaker. The audio processor 100 may increase the audio signal power by filtering the audio input signal to increase the lower frequencies. Alternatively, or in addition, the audio processor 100 may increase the audio signal power by generating a DC offset which may be added to the audio output signal on the audio output 106. In other examples the DC offset may be added to the audio output signal after the speaker driver output 108 (connection not shown). In other examples, the audio processor may add an inaudible reference signal to the audio input signal to increase the audio signal power. The reference signal may have fixed or varying amplitude.

The inventor of the present disclosure has appreciated that by increasing the audio signal power at low temperatures for example below 0 degrees, additional heat is dissipated in the voice coil of the loudspeaker which may be used to heat the speaker.

The ambient temperature has a large influence on the suspension of a loudspeaker. The basic influence is a stiffening of the suspension as ambient temperature is decreased and a reduction of stiffness as temperature is increased. As a result, the resonance frequency of the loudspeaker increases as ambient temperature decreases (and vice versa). A scenario where this behaviour is particularly noticeable is that of a subwoofer in a very cold environment. For temperatures below 0° C., the resonance frequency increases considerably with respect to its value at room temperature. The resonant frequency may increase for example from 40 Hz to 100 Hz. Correspondingly, the acoustical transfer function of the loudspeaker changes from a second-order high-pass function with a corner frequency of 40 Hz to a second-order high-pass function with a corner frequency of 100 Hz.

Figure 2:
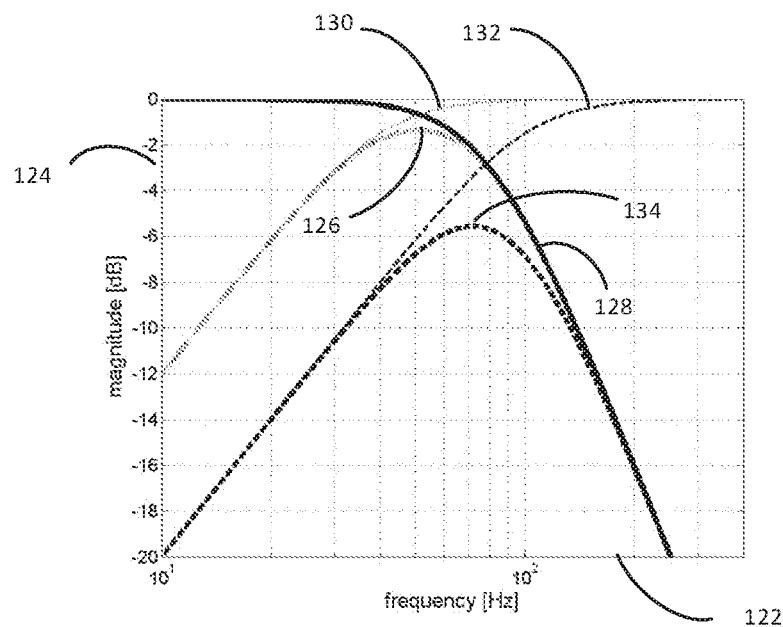
FIG. 2 illustrates a graph showing an example variation of speaker response with temperature.

FIG. 2 illustrates an example acoustical transfer function variation with temperature 120 for a subwoofer loudspeaker. The x-axis 122 shows frequency on a logarithmic scale from 10 Hz to 400 Hz. The y-axis 124 shows the response in decibels on a linear scale ranging from −20 dB to 0 dB. A subwoofer typically receives an audio signal from which the high frequencies have been removed by a cross-over filter network, consisting of a low-pass and a high-pass filter. The low-pass section of the cross-over network is shown as the thick solid line 128. An example acoustical transfer function of a subwoofer at low temperatures, for example below 0° C. is shown by line 132. An example acoustical transfer function of a subwoofer at nominal ambient temperature, for example approximately 20° C., is shown by lines 130. The combined transfer function of the acoustical output of the subwoofer with cross-over filter network is represented by the thick dashed line 134 and thick dotted line 126, respectively for a low and a nominal ambient temperature. It can be observed that the transfer function for the subwoofer at low temperature shown by line 134 is considerably lower in magnitude than that at nominal temperature shown by line 126. The lower magnitude of the response results in the output of the subwoofer being less loud at low temperatures. This may result in a reduced bass response of a car audio system. The perceived audio quality of the audio system may therefore be reduced.

Consequently, by increasing the audio power at low temperatures, the audio processor 100 may cause the speaker to warm up which may improve the audio response of the car audio system. Furthermore, increasing the audio power particularly at low temperatures may correct for the reduced bass response of the car audio system.

Figure 3:
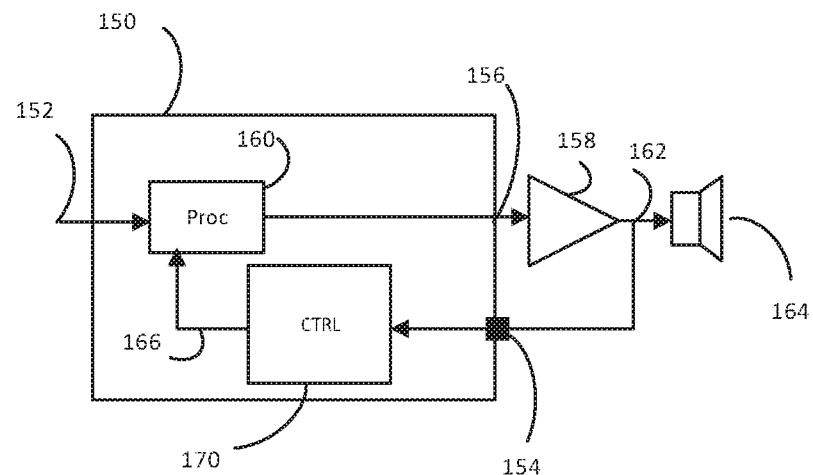
FIG. 3 illustrates an audio processor according to an embodiment.

FIG. 3 shows an audio processor 150 according to an embodiment. The audio processor 150 may have an audio input 152, a sensor input 154, and an audio output 156. The audio processor is may include a controller 170 and a processor module 160 including a mixer. The sensor input 154 may be connected to an input of the controller 170. A controller output 166 may be connected to a first input of the processor module 160. A second input of the processor module 160 may be connected to the audio input 152. An output of the processor module 160 may be connected to the audio output 156.

In operation, the audio output 156 may be connected to a speaker driver 158. The speaker driver output 162 may be connected to an input of loudspeaker 164. The sensor input 154 may be connected to the input of the loudspeaker 164. The combination of the audio processor 150, the speaker driver 158 and the speaker 164 may be included in an audio system, for example as part of a car infotainment system.

In operation, the controller 170 may generate an infrasonic pilot tone having a first constant frequency and amplitude. The pilot tone may be output on the controller output 166. This pilot tone or reference signal may have a frequency of 20 Hz or lower. The pilot tone may be mixed with a normal audio signal received on audio input 152 and output on the audio output 156 by the processor module 160. The generated pilot tone output from the speaker driver output 162 to the voice coil of the loudspeaker 164 may be detected on the sensor input 154. The controller 170 may determine a value of the current flowing into the speaker voice coil at the pilot tone frequency relative to the expected current from a comparison of the transmitted and received pilot tone. The value of the received current may vary dependent on the temperature. Consequently, the detected current value may be used to indicate the temperature. In response to the detected temperature being below a threshold value, the controller 170 may increase the amplitude of the pilot tone. This in turn increases the power of the overall audio signal output on the audio output 156. The increased audio signal power may cause the speaker to heat up which may improve the audio response of an audio system.

In audio processor 150, the same pilot tone frequency may be used to determine the voice coil current and to heat up the loud speaker. In other example audio processors, different pilot tones may be used. In some examples the audio processor may increase the amplitude of the normal audio signal instead of or as well as that of the pilot tone in response to the temperature being below a threshold value.

Figure 4:
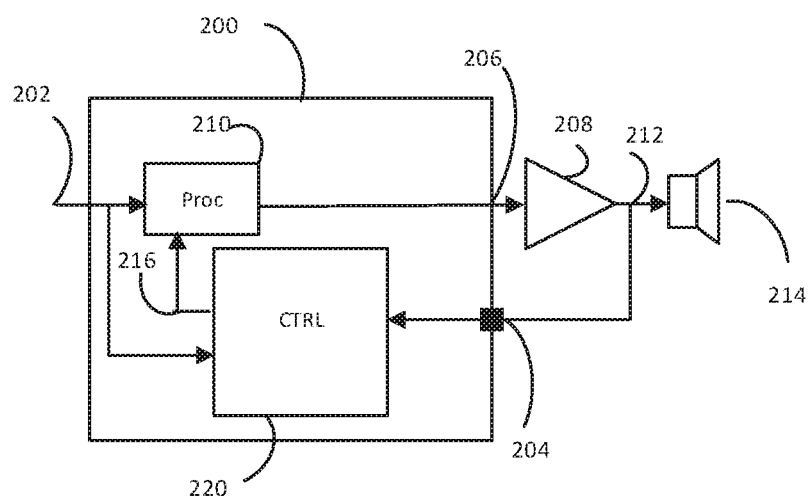
FIG. 4 shows an audio processor according to an embodiment.

FIG. 4 shows an audio processor 200 according to an embodiment. The audio processor 200 may have an audio input 202, a sensor input 204, an audio output 206, a controller 220, and a processor module 210. The sensor input 204 may be connected to a first input of the controller 220. The audio input 202 may be connected to a second input of the controller 220. A controller output 216 may be connected to a first input of the processor module 210. A second input of the processor module 210 may be connected to the audio input 202. An output of the processor module 210 may be connected to the audio output 206.

In operation, the audio output 206 may be connected to a speaker driver 208. The speaker driver output 212 may be connected to an input of loudspeaker 214. The sensor input 204 may be connected to the input of the loudspeaker 214. The combination of the audio processor 200, the speaker driver 208 and the speaker 214 may be included in an audio system, for example as part of a car infotainment system.

The controller 220 may receive a signal representative of the current flowing into the speaker voice coil. The controller 220 may predict the expected voltage across the loudspeaker voice coil from an analysis of the input audio signal received on the audio input 202. On the basis of the current flowing into the voice coil and the predicted voltage across the voice coil, several metrics may be determined by the controller 220 that give a measure of the temperature. The resonance frequency of the loudspeaker 214 varies with temperature and may be used as a metric. If the resonance frequency is above a given threshold value, corresponding to the temperature being below a predetermined threshold, active heating of the speaker 214 may be enabled. Another metric may be the DC resistance of the loudspeaker 214. If the DC resistance of the loudspeaker is below a certain threshold, corresponding to the temperature being below a predetermined threshold, active heating of the speaker 214 may be enabled by the audio processor 200.

In response to the detected temperature being below a threshold value, the controller 200 may enable active heating of the speaker by adapting the filtering operation of the audio signal of the processor module 210 via controller output 216. The processor module 210 may be adapted to boost the low frequency content of the audio signal received on the audio input 202. The low frequency content in this case may be considered as content with frequencies below 200 Hz. The processor module 210 may perform equalization and (multiband) dynamic range compression on the audio input signal to boost the low frequency content. Boosting the low frequencies may increase the power of the overall audio signal output on the audio output 206. The resulting increase in power dissipated in the loudspeaker 214 may cause the speaker to heat up which may improve the audio response of an audio system.

Figure 5:
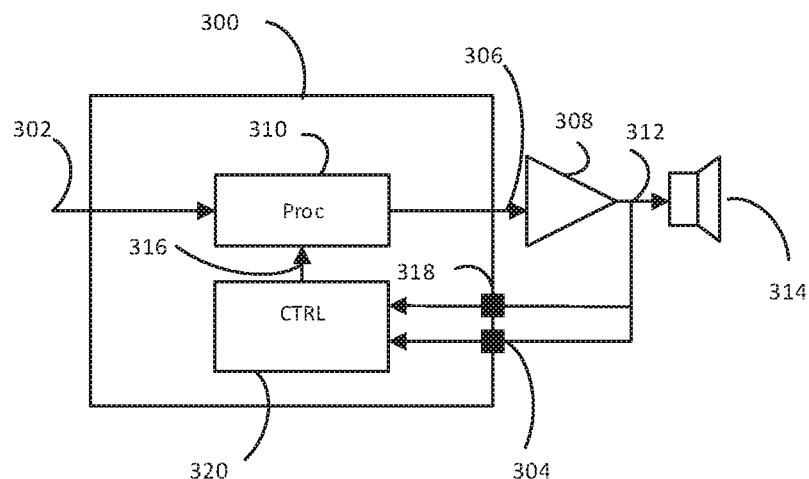
FIG. 5 illustrates an audio processor according to an embodiment.

FIG. 5 shows an audio processor 300 according to an embodiment. The audio processor 300 may have an audio input 302, current sensor input 304, voltage sensor input 318, an audio output 306, a controller 320, and a processor module including a filter 310. The current sensor input 304, may be connected to a first input of the controller 320. The voltage sensor input 318, may be connected to a second input of the controller 320. A controller output 316 may be connected to a first input of the processor module 310. A second input of the processor module 310 may be connected to the audio input 302. An output of the processor module 310 may be connected to the audio output 306.

In operation, the audio output 306 may be connected to a speaker driver 308 which may be a class D audio amplifier. The speaker driver output 312 may be connected to an input of loudspeaker 314. The current sensor input 304 may be connected to the input of the loudspeaker 314. The voltage sensor input 318 may be connected across the voice coil of the loudspeaker 314. The combination of the audio processor 300, the speaker driver 308 and the speaker 314 may be included in an audio system, for example as part of a car infotainment system.

The controller 320 may receive a signal representative of the current flowing through the speaker voice coil detected on current sensor input 304. The controller 320 may detect the voltage across the loudspeaker coil detected from the voltage sensor input 318. On the basis of the current flowing through the voice coil and the voltage across the voice coil, several metrics may be determined by the controller 320 that give a measure of the temperature. The resonance frequency of the loudspeaker varies with temperature and can be used as metric. The resonance frequency can for instance be determined by estimating the transfer function from current to voltage (impedance) and determining the frequency corresponding to the peak in magnitude or to the zero-crossing of the phase. Alternatively, the voltage and current may be used to optimise the parameters of a loudspeaker model which include the resonance frequency. If the resonance frequency is above a given threshold value, corresponding to the temperature being below a predetermined threshold, active heating of the speaker 314 may be enabled. Another metric may be the DC resistance of the loudspeaker. If the DC resistance of the loudspeaker is below a certain threshold, corresponding to the temperature being below a predetermined threshold, active heating of the speaker 314 may be enabled.

In response to the detected temperature being below a threshold value, the controller 370 may enable active heating of the speaker by generating a DC voltage on the DC offset output 368. The generated DC voltage may be added to the audio output signal 356. Alternatively, a control value on the DC offset output 368 may be used by the speaker driver 358 to add a DC voltage to the speaker driver output 362. The resulting increase in power dissipated in the loudspeaker 364 may cause the speaker to heat up which may improve the audio response of an audio system.

Figure 6:
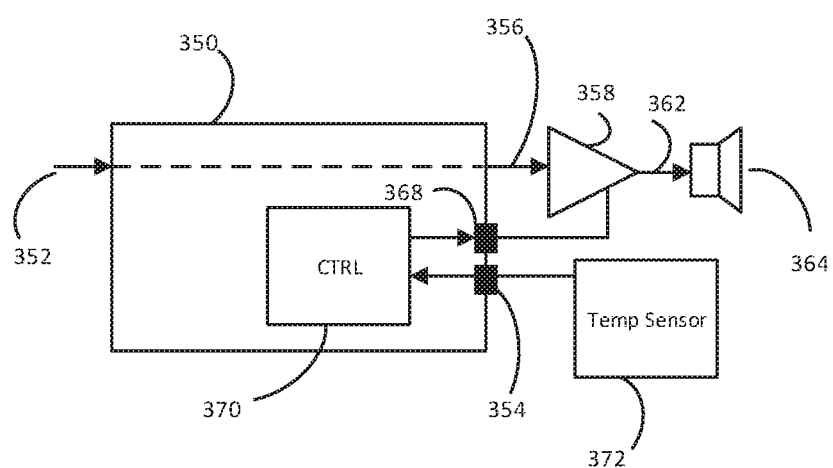
FIG. 6 shows an audio processor according to an embodiment.

FIG. 6 shows an audio processor 350 according to an embodiment. The audio processor 350 may have an audio input 352, sensor input 354, an audio output 356, and a controller 370. The sensor input 354 may be connected to an input of the controller 370. A controller output may be connected to a DC offset output 368.

In operation, the audio output 356 may be connected to a speaker driver 358. The speaker driver output 362 may be connected to an input of loudspeaker 364. The sensor input 354 may be connected to an ambient temperature sensor 372. The DC offset output 368 may be connected to a second input of the speaker driver 358. The combination of the audio processor 350, the speaker driver 358 and the speaker 364 may be included in an audio system, for example as part of a car infotainment system.

Figure 7:
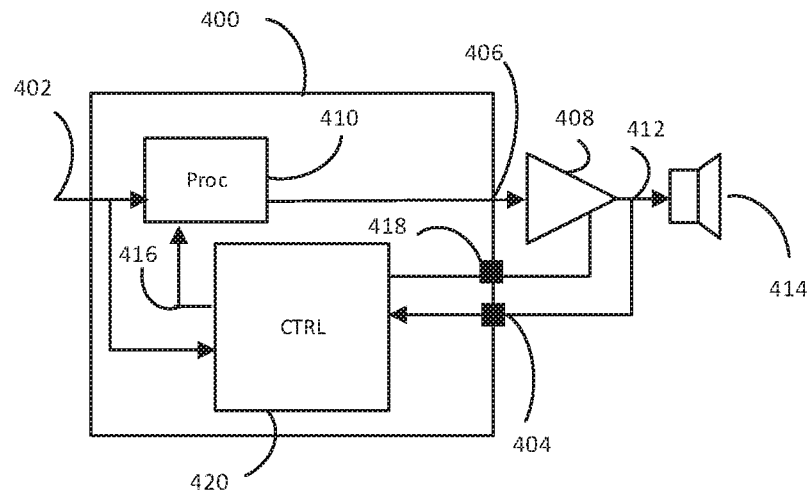
FIG. 7 illustrates an audio processor according to an embodiment.

In response to the detected temperature being below a threshold value, the controller 370 may enable active heating of the speaker by generating a DC voltage on the DC offset output 368. The generated DC voltage may be added to the audio output signal 356. Alternatively, a control value on the DC offset output 368 may be used by the speaker driver 358 to add a DC voltage to the speaker driver output 362. The resulting increase in power dissipated in the loudspeaker 364 may cause the speaker to heat up which may improve the audio response of an audio system, FIG. 7 shows an audio processor 400 according to an embodiment. The audio processor 400 may have an audio input 402, a sensor input 404, an audio output 406, a controller 420 and a processor module 410. The sensor input 404 may be connected to a first input of the controller 420. The audio input 402 may be connected to a second input of the controller 420. A controller output 416 may be connected to a first input of the processor module 410. A second input of the processor module 410 may be connected to the audio input 402. An output of the processor module 410 may be connected to the audio output 406. ADC offset output 418 may be connected to a second controller output.

In operation, the audio output 406 may be connected to a speaker driver 408. The speaker driver output 412 may be connected to an input of loudspeaker 414. The sensor input 404 may be connected to the input of the loudspeaker 414. The DC offset output 418 may be connected to a second input of the speaker driver 408. The combination of the audio processor 400, the speaker driver 408 and the speaker 414 may be included in an audio system, for example as part of a car infotainment system.

The controller 420 may receive a signal representative of the current flowing into the speaker voice coil detected on the sensor input 414. The controller 420 may predict the expected voltage across the loudspeaker coil from an analysis of the input audio signal received on the audio input 402.

The controller 420 may generate an infrasonic pilot tone having a first constant frequency and amplitude on the controller output 416. This pilot tone may have a frequency of 20 Hz or less. This pilot tone may be mixed with a normal audio signal received on audio input 402 by the processor module 410. The combined signal may be output on an audio output 406. The generated pilot tone output from the speaker driver output 412 to the loudspeaker voice coil may be detected on the sensor input 414. The controller 420 may determine a value of the current flowing into the speaker voice coil relative to the expected current from a comparison of the transmitted and received pilot tone.

Alternatively, or in addition, the controller 420 may determine, on the basis of the current flowing into the voice coil and the predicted voltage across the voice coil, several metrics that give a measure of the temperature. The resonance frequency of the loudspeaker varies with temperature and can be used as metric. If the resonance frequency is above a given threshold value, corresponding to the temperature being below a predetermined threshold, active heating of the speaker 414 may be enabled. Another metric may be the DC resistance of the loudspeaker. If the DC resistance of the loudspeaker is below a certain threshold, corresponding to the temperature being below a predetermined threshold, active heating of the speaker 414 may be enabled.

In response to the detected temperature being below a threshold value, the controller 420 may increase the audio signal power in several different ways. Firstly, the amplitude of the pilot tone may be increased. This in turn increases the power of the overall audio signal output on the audio output 406.

Alternatively or in addition to altering the amplitude of the pilot tone, the controller 420 may generate a DC voltage on the DC offset output 418 which may be added to the audio signal at the speaker driver output 412, or generated and added by the speaker driver 408. By adding a DC offset to the audio signal, more power may be dissipated in the voice coil of the loudspeaker 414 causing the loudspeaker voice coil to heat up.

The controller 420 may in addition control the processor module 410 to modify the incoming audio signal received on audio input 402 via controller output 416. The processor module 410 may for example filter the audio signal to boost the lower frequencies which may increase the power dissipated in the loudspeaker coil.

The self-heating of the loudspeaker caused by increasing the audio signal power may improve the audio response of an audio system.

Figure 8:
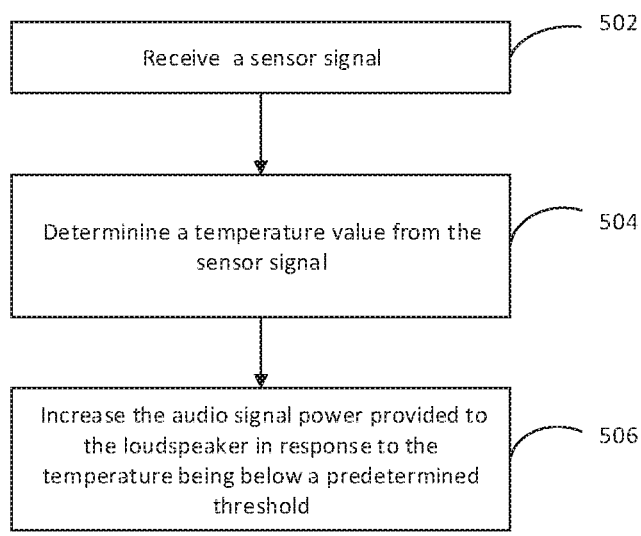
FIG. 8 illustrates a method of audio processing according to an embodiment.

FIG. 8 shows a method of audio processing 500. A sensor signal is received in 502, the sensor signal may be used to derive a parameter representing a value of temperature. This sensor signal may be for example the loudspeaker voice coil current and/or voltage or a signal from a temperature sensor. In step 504 a temperature value may be determined from the sensor signal.

A loudspeaker current and voltage may be used to determine a value of resonant frequency of the loudspeaker or the DC resistance of the loudspeaker. The resonant frequency and DC resistance vary with temperature so may be considered to represent a value of temperature. In step 506 the audio signal power may be increased in response to the temperature being below a predetermined threshold. The audio signal power may be increased by a filtering operation for example to boost the low frequency content and therefore, increase the power dissipated in the loudspeaker due to which the voice coil will heat up. The filtering operation may be related to the loudspeaker resonance frequency to compensate for the loss of low-frequency reproduction. The audio signal power may be increased by the addition of a signal that is designed to be inaudible and still dissipate power in the loudspeaker, due to which the voice coil will heat up. One such signal is a sine wave at a frequency below the audio frequency band for example between 2 Hz and 20 Hz. Another such signal may be a DC offset.

By modifying the audio signal in response to a low temperature, the speaker may be actively heated by increasing the power dissipated in the voice coil. This may improve the audio response of the speaker at low temperatures.

Figure 9A:
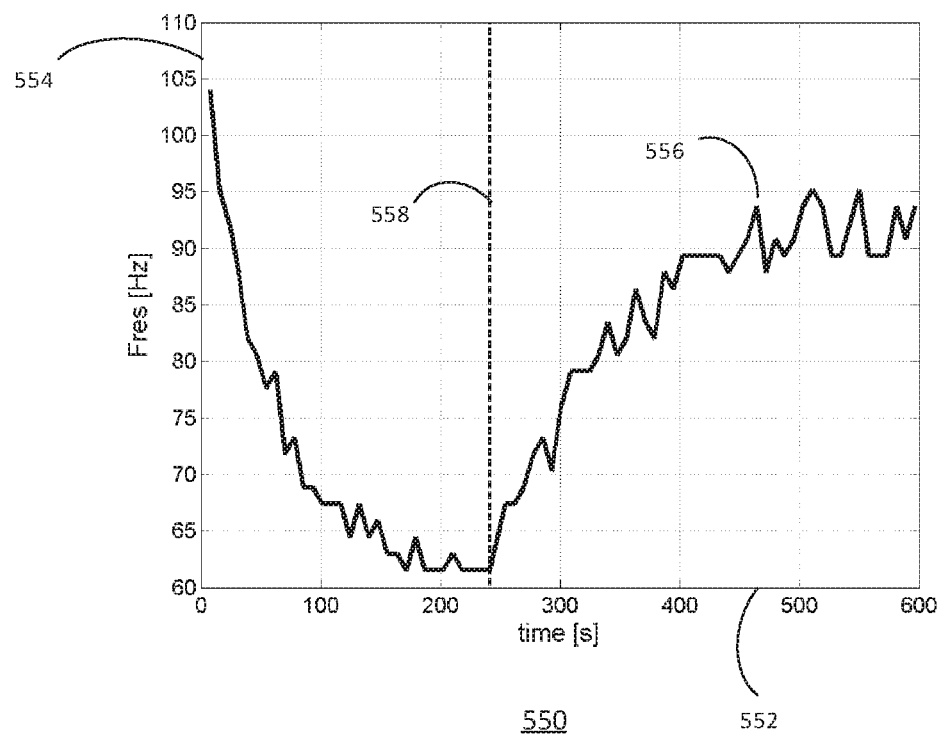
FIG. 9A shows a graph illustrating the variation of resonant frequency against time.
Figure 9B:
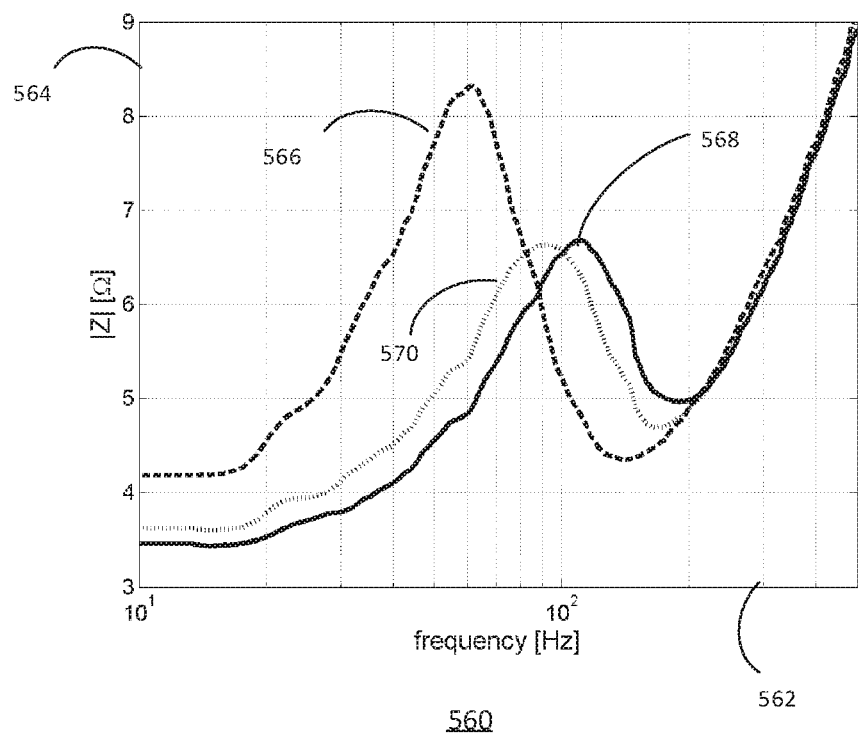
FIG. 9B shows a graph illustrating speaker characteristics at different temperatures.

FIGS. 9A and 9B show an example effect of the active heating for a subwoofer speaker at an initial ambient temperature of −10 degrees Celsius. FIG. 9A shows a graph 550 illustrating the variation of resonant frequency on the Y-axis 554 from 60 Hz to 110 Hz against time on the X axis 552 varying between 0 and 600 seconds.

FIG. 9B shows a graph 560 illustrating speaker characteristics at different temperatures. The Y-axis 564 shows the variation of impedance between 3 Ohms and 9 Ohms on a linear scale. The X-axis 562 has frequency on a logarithmic scale between 10 Hz and 500 Hz. Line 568 shows the variation of impedance versus frequency at −10 Celsius. Line 566 shows the variation of impedance versus frequency after active heating according to various examples described herein is applied. Line 570 shows the variation of impedance versus frequency at −9 Celsius, when the effect of the active heating has almost vanished (at t=600 seconds).

The subwoofer with a nominal resonance frequency of 35 Hz is put in a temperature chamber with a temperature of −10 Celsius, and is given sufficient time to acclimatise. The impedance curve at this point is represented by the curve 568 of graph 560 and shows a resonance frequency of 104 Hz corresponding to the value at t=0 in graph 550. Active heating is performed by playing a sine wave at 20 Hz with a peak amplitude of 10V for the first 240 seconds shown be dashed line 558. As can be observed in graph 550 on the left side of the dashed line 558, the resonance frequency reduces to 62 Hz, corresponding to the dashed impedance curve 566 in graph 560, i.e. closer to the nominal operating frequency of 35 Hz. After the active heating is stopped, the resonance frequency increases again to 92 Hz, corresponding to the dotted curve 570 in graph 560, since the temperature chamber is still at −9 degrees Celsius, the ambient temperature having increased by 1 degree Celsius during the test.

Embodiments of the audio processor described herein may be implemented as hardware, or a combination of hardware and software. For example, the audio processor may be implemented in logic or as software running on a digital signal processor. The term audio processor as used herein refers to the processing of signals in the range of DC to 200 kHz so includes signals in the ultrasound and infrasound regions in addition to audible signal frequencies.

An audio processor is described. The audio processor includes a sensor input; an audio input for receiving an audio input signal; an audio output for outputting an audio signal to a loudspeaker. The audio processor is configured to determine a parameter value representative of temperature from a sensor signal received on the sensor input; process a received audio input signal by increasing the audio signal power in response to the temperature being below a predetermined threshold; and output the processed audio signal on the audio output.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness, it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. An audio processor comprising:
a sensor input;
an audio input for receiving an audio input signal; and
an audio output for outputting an audio output signal to a loudspeaker having a voice coil;
wherein the audio processor is configured to:
determine a resonant frequency of the loudspeaker as representative of temperature from a voice coil voltage and a sensor signal received on the sensor input, wherein the sensor signal corresponds to a current flowing into the voice coil; and
a controller having an input coupled to the sensor input, and a controller output, wherein the controller is configured to:
increase an audio signal power in response to the resonant frequency value being above a predetermined resonant frequency threshold value, wherein the audio signal power is increased to heat the loudspeaker until the resonant frequency is below the predetermined threshold.

2. The audio processor of claim 1, wherein:
the audio processor is further configured to determine a value representative of temperature based on the current flowing into the voice coil; and
the controller is further configured to generate a control output signal in response to the temperature being below a predetermined threshold.

3. The audio processor of claim 2 further comprising a processor module having a first input coupled to the audio input, a second input coupled to the controller output, and an output coupled to the audio output.

4. The audio processor of claim 3 wherein the processor module comprises a mixer and the controller is configured to generate a reference signal comprising one or more frequencies below an audible frequency band, wherein the generated control output signal comprises the reference signal and the audio processor is configured to increase the audio signal power by mixing the reference signal with the audio input signal.

5. The audio processor of claim 3, wherein the processor module comprises at least one of a dynamic range compressor and an equalizer and wherein the processor module is configured to increase the audio signal power by processing the audio input signal to increase the signal power of the audio input signal at frequencies below a predetermined value and outputting the processed audio signal.

6. The audio processor of claim 1 wherein the sensor input is configured to be coupled to the loudspeaker.

7. The audio processor of claim 1 further comprising a voltage sensor input configured to be coupled to the loudspeaker, wherein the voltage sensor input is coupled to the controller and the controller is configured to detect the voice coil voltage from a voltage sense signal received on the voltage sensor input.

8. The audio processor of claim 1 wherein the audio input is coupled to the controller and the controller is configured to determine the voice coil voltage value from the sensor signal.

9. The audio processor of claim 1 wherein the controller is further configured to determine a DC resistance of the voice coil from the voice coil voltage and the current flowing into the voice coil, and wherein the audio processor is further configured to increase the audio signal power in response to the DC resistance being below a predetermined DC resistance threshold value.

10. The audio processor of claim 1, wherein the controller comprises a further output configured to be coupled to a speaker driver and wherein the generated control output signal increases a DC offset of the output signal from the speaker driver, wherein the increased DC offset increases the audio signal power.

11. An audio system comprising the audio processor of claim 1 and further comprising a speaker driver having an input coupled to the audio output and an output coupled to the loudspeaker.

12. A method of audio processing, the method comprising:
receiving a sensor signal, wherein the sensor signal indicates a current flow through a voice coil of a loudspeaker;
determining a resonant frequency representative of temperature from the sensor signal, wherein determining the resonant frequency is based on a voice coil voltage and the received sensor signal; and
increasing audio signal power provided to the loudspeaker in response to the resonant frequency being above a predetermined resonant frequency threshold value until the resonant frequency is below the predetermined resonant frequency threshold.

13. The method of claim 12, further comprising increasing the audio signal power by at least one of:
generating a signal comprising one or more frequencies below an audible frequency band and combining the generated signal with an audio input signal;
adding a DC offset to an audio output signal;
equalizing the audio input signal to increase an amplitude of the audio signal at frequencies below a predetermined value; and
performing a dynamic range compression of the audio input signal.

14. The method of claim 12, further comprising:
determining a value of DC resistance of the voice coil from the voice coil voltage and the sensor signal; and
increasing the audio signal power in response to the value of the DC resistance being above a predetermined DC resistance threshold value.

15. The method of claim 12, further comprising:
determining a value representative of temperature based on the current flowing into the voice coil; and
increasing the audio signal power provided to the loudspeaker in response to the temperature being below a predetermined temperature threshold by generating an infrasonic pilot tone having a first constant frequency of 20 Hz or lower and outputting the infrasonic pilot tone to the loudspeaker.

16. The method of claim 12, further comprising:
determine a DC resistance of the voice coil from the voice coil voltage and the current flowing into the voice coil; and
increasing the audio signal power in response to the DC resistance being below a predetermined DC resistance threshold value.

17. The method of claim 13, wherein combining the generated signal with the audio input signal to increase the audio signal power comprises mixing the generated signal with the audio input signal.

18. The method of claim 13, further comprising generating a control signal in response to a temperature being below a predetermined threshold.

19. The method of claim 18, further comprising increasing the DC offset of the audio output signal based on the generated control output signal to increase the audio signal power.

20. The audio processor of claim 1, wherein the audio processor is further configured to:
apply a filtering operation to the audio input signal via the controller output by boosting a low frequency content of the audio output signal, wherein the low frequency content includes content with one or more frequencies below 200 Hz.

* * * * *